United States Patent [19]

Melas et al.

[11] Patent Number: 4,506,815
[45] Date of Patent: Mar. 26, 1985

[54] BUBBLER CYLINDER AND DIP TUBE DEVICE

[75] Inventors: Andreas A. Melas, Burlington; John W. O'Grady, Jr., Gloucester, both of Mass.

[73] Assignee: Thiokol Corporation, Chicago, Ill.

[21] Appl. No.: 448,160

[22] Filed: Dec. 9, 1982

[51] Int. Cl.³ .............................................. B65D 83/00
[52] U.S. Cl. ...................................... 222/630; 406/142
[58] Field of Search ................. 222/394, 399, 3, 571, 222/630; 406/141, 142, 146; 260/448 A, 431, 429 R, 429.9; 427/230

[56] References Cited

U.S. PATENT DOCUMENTS

| | | | |
|---|---|---|---|
| 1,769,904 | 7/1930 | Bagley | 222/630 |
| 1,892,750 | 1/1933 | Rotheim | 222/394 |
| 3,179,290 | 4/1965 | Whitney | 222/571 |
| 3,339,811 | 9/1967 | Haag | 222/394 |

FOREIGN PATENT DOCUMENTS 477319 7/1972 Japan ............................ 222/630

Primary Examiner—Joseph J. Rolla
Assistant Examiner—Kenneth Noland
Attorney, Agent, or Firm—Gerald K. White

[57] ABSTRACT

An all welded square bottomed stainless steel cylinder and dip tube device for transferring by vapor deposition very reactive electronic grade organometallic liquid to a deposition system includes a top fill opening and inlet and outlet diaphragm valves, and is coated on the interior with PVF Teflon to several thousandths of an inch thickness. Contamination of the liquid is eliminated or at least substantially minimized since the device is stable in an upright position, the diaphragm valves each have a very small and inert area exposed to the liquid, and the coating serves as a barrier to contamination of the liquid by the metal of which the cylinder and dip tube are made.

9 Claims, 4 Drawing Figures

| VOL<br>cc | A<br>mm | B<br>mm | C<br>mm |
|---|---|---|---|
| 200 | 153 | 133 | 203 |
| 450 | 270 | 250 | 320 |
| 750 | 470 | 450 | 520 |

BUBBLER CYLINDER AND DIP TUBE DEVICE

BACKGROUND OF THE INVENTION

1. Field of the Invention

This invention relates to bubbler devices for transferring electronic grade organometallic compounds from a container of such compounds to a deposition system, for example, a chamber wherein crystalline or other substances are being grown on substrates or are otherwise being treated by a process known as "doping" in the production of electronic products such as semiconductor elements or monolithic circuits.

2. Description of the Prior Art

It is known in the prior art to use a bubbler technique for transferring by vapor deposition doping compounds in liquid form from a container of such compounds, generally, a non-refillable cylindrical cartridge, to a deposition system. Such bubbler technique involves the introduction, through an inlet valve and a dip tube, to the bottom of the cartridge of a gas under pressure, a gas such as hydrogen which is inert to the doping compound. In bubbling up through the doping compound, molecules of the compound intermingle with those of the gas. The gas, saturated with the vapor of the compound, is withdrawn through an outlet valve where it is delivered to the deposition system. It has been the practice in the prior art to use a bellows seal valve for both the inlet and outlet valves.

Bubbler cylindrical cartridge and dip tube assemblies including inlet and outlet bellows valves, as mentioned above, are commercially available, typical examples being the assembly manufactured by Texas Alkyls, Inc., P.O. Box 1381, Houston, Tex. 77001, for whom the exclusive sales agent is Stauffer Chemical Company, Specialty Chemical Division, Westport, Conn. 06881, and that manufactured and sold by Thiokol/Ventron Division Alfa Products, 152 Andover Street, Danvers, Mass. 01923. The prior art cylindrical cartridge and dip tube assemblies are characterized in that they are intended to protect the organometallic compound during shipment and storage as well as to provide a method for dispensing the compound to a deposition system.

A number of problems with such bubbler assemblies or devices have been encountered in the prior art particularly where the doping materials are electronic grade organometallic compounds. Such compounds are very reactive and react with the metal of the container or cylindrical cartridge and the bellows valves, even when made of stainless steel, and are easily contaminated thereby. Additionally, there has been a tendency for the bellows valves, and the dip tube also, to become clogged. Vapor entering the convolutions of a bellows valve and coming into contact with air (the bellows being difficult to adequately purge), reacts with the air and produces powders which tend to clog the valve and render it useless. This is a serious consideration with very high purity organometallic compounds that are used in the semiconductor and related industries where air contamination is very critical and clogging of a valve is potentially very hazardous.

Not only are the organometallic compounds easily contaminated, but they are also prone to leakage. This situation has been aggravated in the prior art by the shape and arrangement of the cylindrical cartridge or cylinder, the bottom portion having a generally oval shape narrowing down to the size of an opening that is provided for filling the cartridge and which is closed by a plug. Such cylinders thus have the disadvantages of not being stable in an upright position, and also of having a tendency to leak in the upright as well as other positions.

The narrowing or oval shape of the lower portion of the prior art cartridges has a further disadvantage in that it detracts from an overall average consistency or uniformity in the rate of transfer of the organometallic vapor from the cartridge to the deposition system. This is for the reason that the volume of the liquid through which the continuing flow of the bubbles rise to become saturated with the organometallic vapor diminishes as the level of the liquid drops.

Since organometallic compounds are very expensive, such contamination, leakage, and the inability to utilize uniformly the complete contents of the cartridge have added significantly to the cost and efficiency of the doping procedures.

SUMMARY OF THE INVENTION

An object of the invention is to provide an improved bubbler device for use in the doping of products such as semiconductor materials and monolithic circuits with electronic grade organometallic compounds in which the aforementioned problems of the prior art are overcome or minimized.

A more specific object of the invention is to provide such a device wherein the interior of the non-refillable cylinder and the dip tube therein are provided with a coating which serves as a barrier to contamination of the electronic grade organometallic liquid compounds contained therein by the metal of which the cylinder and dip tube are made.

Another specific object of the invention is to provide for such a device an improved shape for the cylinder, one wherein the diameter or width may be the same for all sizes and the length to width, or aspect, ratio is very high whereby to achieve more effective saturation of the continuing flow of gas bubbles with the vapor of the organometallic compound.

Another object of the invention is to provide such a device wherein the cylinder may be filled from the top, wherein the cylinder bottom is flat and thus able to sit upright and help avoid leakage through the valves, and wherein the bottom interior of the cylinder is not flat, a small machined recess being provided therein, whereby more of the organometallic liquid may be used.

A further specific object of the invention is to provide for such a device an all welded cylinder and dip tube package which, between the inlet and outlet valves, may be completely sealed, as manufactured, and maintained in such sealed state during shipment and storage until fully installed between the source of gas to be used for bubbling and a deposition system.

Still another specific object of the invention is to provide such a package wherein a diaphragm valve is provided at each of the inlet and outlet passages to the container, such valve being characterized in having a very small and inert area or region exposed to the organometallic compound vapor or liquid and wherein the seal is effected from an unexposed part of the valve thereby eliminating or at least minimizing the tendency for organometallic vapor to come into contact with air to cause clogging.

In accomplishing these and other objectives of the invention, there is provided a cylinder and dip tube package containing electronic grade organometallic compound in liquid form such as Diethyltelluride, Te(C$_2$H$_5$)$_2$, Diethylzinc, Zn(C$_2$H$_5$)$_2$, Dimethylcadmium, Cd(C$_2$H$_3$)$_2$, Dimethylmercury, Hg(CH$_3$)$_2$, Dimethyltelluride, Te(CH$_3$)$_2$, Trimethylgallium Ga(CH$_3$)$_3$, Trimethylindium In(CH$_3$)$_3$, Trimethylaluminum Al(CH$_3$)$_3$, and other group II, III, V, and VI metal alkyls. The package includes a cylindrical stainless steel container, a stainless steel dip tube, a sealed controllable gas inlet valve means, adapted for connection to a source of gas, such as hydrogen, that is inert to the organometallic liquid, and a controllable vapor outlet valve means for connection to a deposition system.

In accordance with the invention, the inlet and outlet valve means each comprises a diaphragm type valve which, when closed, completely seals the electronic grade organometallic material in the cylinder, all seams being welded, the cylinder exterior bottom being flat thus enabling the cylinder to sit upright, and a fill opening being provided at the top thereof, whereby there is minimized the possibility that the highly reactive and expensive organometallic material may tend to leak. The interior of the stainless steel cylinder and the interior and exterior of the dip tube are provided with a coating of polyvinylidine fluoride (PVF) Teflon (a trademark of E. I. DuPont de Nemours and Company) and the generic name for which is tetrafluorethylene, or any other suitable material, as a barrier to contamination of the organometallic liquid by the metal of the cylinder and of the dip tube. The dip tube is cut an angle to minimize the tendency to clogging. A centrally located square recess is provided at the interior bottom surface of the container to allow more of the organometallic liquid to be used.

Further, in accordance with the invention, the dimensions of the cylinder may be selected to have the same diameter for all sizes and also to have length or height that is large compared to the diameter of the cylinder, the aspect ratio in three specifically contemplated embodiments of the invention being about 2.5, 5 and 9.

BRIEF DESCRIPTION OF THE DRAWINGS

Having summarized the invention, a detailed description follows with reference being made to the accompanying drawings which form part of the specification, of which.

DESCRIPTION OF THE PREFERRED EMBODIMENT

Figures 1, 4:
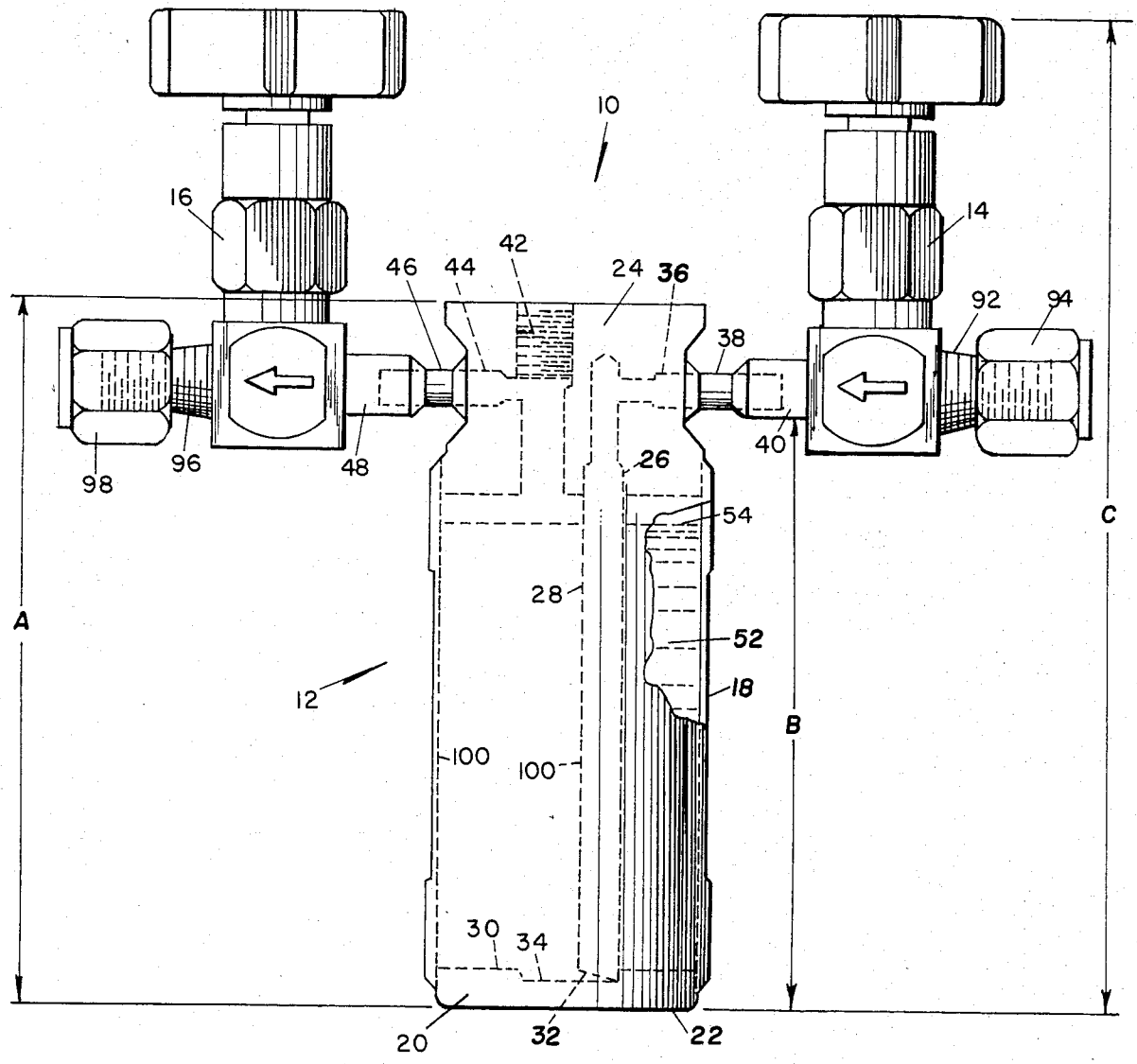
FIG. 1 is a schematic illustration, partly in cross section, showing an embodiment of the cylinder and dip tube package according to the invention.
FIG. 4 is a table giving the dimensions in millimeters (mm) of the lengths designated "A", "B," and "C" in FIG. 1 for three practical embodiments of the invention.
Figure 2:
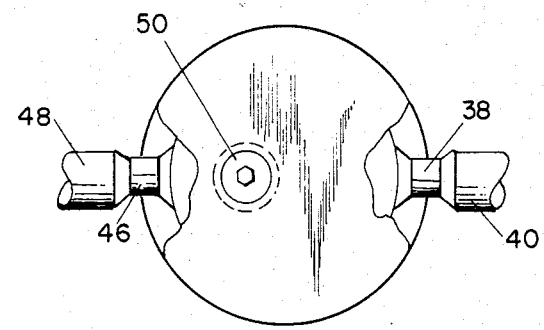
FIG. 2 is a top plan view of the cylinder of FIG. 1, showing the welded socket head pipe plug for the filling opening, and showing, also, the gas inlet and outlet pipe connections to the cylinder and dip tube package.

There is provided in the preferred embodiment of the invention illustrated in FIG. 1 a cylinder and dip tube package for transferring electronic grade organometallic material contained within the cylinder to an adjacent deposition system, for example, a chamber (not shown) wherein crystalline substances are being processed into electronic semiconductor elements or monolithic circuits. The cylinder and dip tube package, indicated generally by the reference numeral 10 includes a vertically disposed closed cylinder or container 12, a controllable gas inlet valve means 14, and a controllable vapor outlet valve means 16. The cylinder 12 comprises a cylindrical elongated tube portion or member 18 having a substantially uniform cross section throughout its length, a circular bottom closing portion or member 20 having a flat bottom 22, and a generally circular top closing portion or member 24, as best seen in FIG. 2. Depending from an inlet opening 26 in the top member 24 of container 12 is a hollow dip tube 28 that extends downwardly to the inner surface 30 of bottom member 20. The lower end of the dip tube 28 is cut at a slant as indicated at 32 and fits into a generally centrally located machined square recess or depression 34 in the inner surface 30 of member 20, with the sharp edge of the end of the dip tube 28 adjacent to an edge of the recess 34.

Members 18, 20 and 24 comprising cylinder 12 desirably are formed of stainless steel and are welded together whereby the seams between them are effectively sealed against leaks. Dip tube 28 also is made of stainless steel and is welded in place in the inlet opening 26. Desirably, such welding operation may be effected at the time of welding top member 24 to the cylinder member 18 and prior to the welding of the bottom member 20 the cylinder member 18 to the end that the sharp edge of the slanted end 32 of dip tube 28 may be accurately positioned adjacent to the bottom of recess 34 in the inner surface 30 of bottom member 20.

The inlet opening 26 in top member 22 includes a branch opening 36 that extends horizontally and in which one end of an inlet tube or pipe 38 is connected, being welded to provide a seal. The pipe 38 extends externally of the member 24. The other end of the tube 38 fits in an outlet pipe or tube 40 of the inlet valve means 14, the connection being sealed by welding.

Also included in the top member 24 is a tapped inlet fill opening 42 from which a branch vapor outlet opening 44 extends diametrically opposite in position to the gas inlet branch opening 36. An outlet tube or pipe 46 is welded at one end in branch opening 44. The other end of tube 46 fits in and is similarly welded to an inlet tube 48 of the outlet valve means 16.

As seen best by reference to FIG. 2, a threaded socket head plug 50 is provided to close the tapped inlet fill opening 42 at the top surface of the member 24. Thus, after the cylinder 12 has been connected to the inlet and outlet controllable valve means 14 and 16, the inlet and outlet valve means being in their closed positions, as described, an organometallic compound 52 in liquid form is introduced into cylinder 18 through the inlet fill opening 42 to a level as indicated at 54 in FIG. 1. When so filled, the socket head plug 50 is screwed in the fill opening 42, thereby sealing the opening 42.

The inlet valve means 14 and the outlet valve means 16 may each desirably comprise a diaphragm valve of a type made and sold by GO INC, 11940 E. Washington Blvd., Whittier, Calif. 90606, and identified as a HIGH PRESSURE DIAPHRAGM SHUT OFF VALVE, DV-3K Series. Such a diaphragm valve, as indicated at 56 in FIG. 3, includes a T-shaped body 58 having a tapped inlet opening 60 and an outlet opening 62, in a bar portion 64, and an opening 66 in a hollow externally threaded stem portion 68. Closing the outer end of stem portion 68 is a diaphragm 70 the circumferential edge of which is welded in sealing relation thereto. A valve plug 72 that is upwardly biased by a spring 74 has its lower end positioned in closely spaced relation to the upper end 76 of a narrow vertical passage 78, thereby forming a weir. The passage 78 is connected at its other end by a narrow upward extending branch passage 80 to the inlet opening 60. Spring 74 is supported by an inner shoulder 84.

Associated with the stem portion 68 of body 58 and diaphragm 70 are a bushing or gland-like member 84, a knob 86 and an attached externally threaded stem 88. Bushing 84 is internally threaded and cooperates at one end with the external threads on stem portion 68 to retain an inner shoulder 90 of bushing 84 in engagement with the circumferential edge of diaphragm 70. Internal threads at the other end of bushing 84 cooperate with external threads on stem 88 whereby rotation of knob 86 in one direction, typically the clockwise direction, is effective, against the force of spring 74, to urge stem 88 downwardly against diaphragm 70 to effect closure of passage 78 at end 76 thereof by valve plug 72. Rotation of knob 86 in the opposite direction is effective to allow spring 74 to move the valve plug up off the end 76 of passage 78 thereby to open the latter.

The body 58 of diaphragm valve 56 is machined of 316 stainless steel bar stock and the internal components thereof are made of 316 stainless steel, inconel and Kel F.

Figure 3:
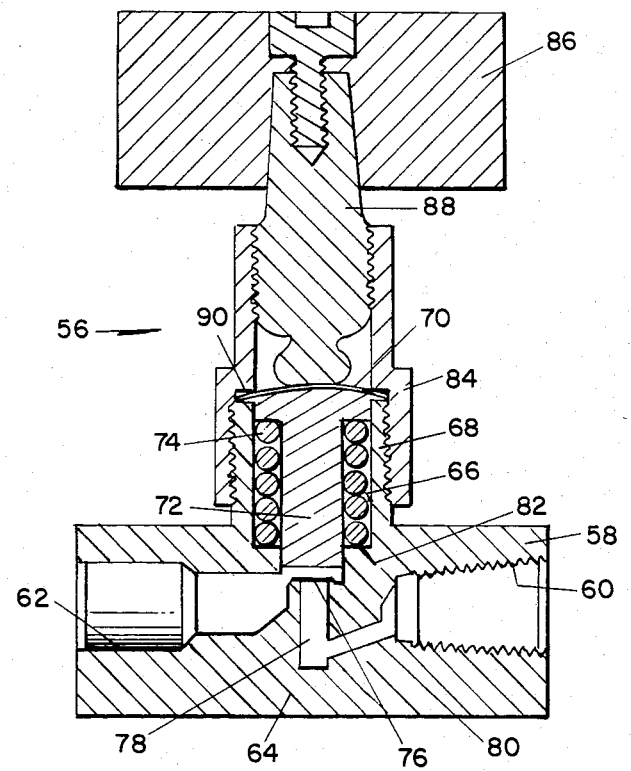
FIG. 3 is a cross sectional view of a diaphragm valve that desirably is employed in each of the inlet and outlet pipe connections.

When a diaphragm valve 56, as illustrated in FIG. 3, is used as the inlet valve means 14, a suitably threaded pipe 92 is screwed into the opening 60 and provided with a coupling 94 for facilitating the attachment of the diaphragm valve 56 to a source of gas such as hydrogen. Outlet tube 40 is connected to the opening 62 and the connection is sealed by welding.

When a diaphragm valve 56 is used as the outlet valve means 16, the inlet pipe 46, as seen in FIG. 1, is connected to the opening 60 of the valve, the opening 60 for the outlet valve not being threaded, and the connection is sealed by welding. A suitably threaded pipe 96 is screwed into opening 62, which in this case is threaded, and provided with a coupling nut 98 for facilitating the attachment of the outlet valve means 16 to the deposition system.

The diaphragm valves 56 employed for the inlet valve means 14 and the outlet valve means 16 may be identical except for the provisions required to allow welding of pipe 40 to the outlet opening 62 in the case of the inlet valve means 14, screw fitting means being provided at the inlet opening 60, and required to allow welding of pipe 48 to the inlet opening 60 and screw fitting means at the outlet opening 62 in the case of the outlet valve means 16.

With this arrangement, wherein the outlet opening 62 of a first diaphragm valve 56 is connected to the inlet opening 26 of the cylinder 12 and the inlet opening 60 of a second diaphragm valve 56 is connected to the outlet opening 44 of the cylinder 12, it is readily apparent that the inner space or volume of each of the diaphragm valves 56 that is exposed to the vapor or liquid 52 in the cylinder 12 is, in each case, very small. Thus, the diaphragm valve 56 comprising the inlet valve means 14 and the diaphragm valve 56 comprising the outlet valve means 16 are each much less contaminating to the organometallic liquid 52 than the larger exposed area of a bellows type valve of the prior art.

In accordance with the invention, the interior of the cylinder 12 including the inside and outside of the dip tube 28 is provided with a coating 100 of PVF Teflon or other suitable coating material several thousandths of an inch thick, desirably being applied by spraying and then baking, in known manner. This coating forms a barrier between the metallic surfaces of the cylinder 12 and dip tube 28 thereby to preclude contamination of the electronic grade organometallic material 52 within the container. The coating completely covers the bottom 30 of the cylinder 12 including the machined recess 34 and extends up the inner walls of tube member 18 above the level 54 of the organometallic liquid 52 stopping short of the location of the weld of top member 24 to the tube member 18.

The use of PVF Teflon is preferred as compared to other types of Teflon because it enables a greater thickness of and denser coating to be applied to the inner walls of the cylinder 12 and dip tube 28, thereby providing a coating that is less penetrable to the organometallic liquid 52, and hence, less subject to contamination by the metal of the cylinder 12 and the dip tube 28. A desirable thickness of the coating 100 is 8–10 mils thick.

In the operation of the bubble cylinder and dip tube package 10, when operatively installed and connected to a gas source and processing chamber, adjustment of the knob 84 of inlet valve means 14 opens the associated diaphragm valve 56 to allow a carrier gas such as hydrogen, or another gas inert to the organometallic liquid 52 and the crystal products being processed in the deposition system, to enter the interior of cylinder 18 through the dip tube 28. At the bottom of the dip tube 28, the gas escapes past the slant cut 32 forming a continuing flow of bubbles which generally are spherical and rise upward, the upward thrust on each bubble being practically equal in magnitude to the weight of a drop of the organometallic liquid of equal diameter in air, smaller bubbles tending to move from side-to-side or in cork screw fashion in their upward travel. During their upward accent, molecules of the organometallic material adhere to or intermingle with the molecules of the bubble of gas and are carried upward above the level 54 of the organometallic material 52 and out through outlet valve means 16 into the deposition system, the outlet valve having also been opened, as by adjustment of the associated knob 86 of the outlet valve means 16.

Thus, in accordance with the invention there has been provided a cylinder and dip tube package 10 containing electronic grade organometallic liquid including a completely welded cylinder with a dip tube therein with the cylinder including inlet and outlet diaphragm valve means connected thereto by welding, the diaphragm valve means presenting a very small end inert area to the vapor or liquid, with the cylinder having a flat bottom and able to sit upright, and the cylinder having the fill opening at the top, thereby minimizing the possibility of contamination and leakage of organometallic material from the cylinder during shipment, storage and use.

Further, in accordance with the invention, the shape of the cylinder 12 may be selected to provide a high aspect ratio, that is to say, a length or height that is relatively great compared to the width or diameter. Specifically, as indicated by the Table of FIG. 4, in one embodiment of the invention, the external diameter of the cylinder portion 18 is two inches or 5.1 centimeters (cm) and the length designated A in FIG. 1 is 153 mm, the length B is 133 mm, and the length C is 203 mm, providing an interior volume of 200 cubic centimeters (cc) for organometallic material. The length of the cylinder 18 in this embodiment thus is roughly twice the width, that is, the diameter of the cylinder portion 18, giving an aspect ratio of about 2.5.

In accordance with the invention, it is contemplated that the length of the cylinder portion 18 may be increased while utilizing the same size bottom circular portion or member 20 and the top circular portion or member 24 with no change thereby to provide, for example, within the cylinder portion 18 a volume of 450 cc. for organometallic liquid, the lengths A, B and C in FIG. 1 for this case being 270 mm, 250 mm and 320 mm, respectively, and providing an aspect ratio of about 5. The cylinder portion or member 18 may also be made in longer lengths, if desired, while maintaining the same diameter. Thus, in a further specifically contemplated embodiment of the invention, the lengths A, B and C in FIG. 1 are 470 mm, 450 mm and 520 mm providing space to accommodate 750 cc. of organometallic liquid and having an aspect ratio of about 7.5.

With a cylinder 12 having a shape as described wherein the cross section of the column of organometallic liquid is uniform throughout its length or height, except for the small recess 34, and wherein the length to width ratio is high, the bubbles saturate with the vapor of the liquid more effectively and more uniformly or consistently than with the prior art structures having oval or conical shaped bottoms.

The cylinder and dip tube package 10 of the present invention is further characterized in that the inlet valve means 14 and the outlet valve means 16, each comprising an identical diaphragm valve 56, are at the same height with each embodiment with the package 10 sitting upright on the flat bottom 22 of member 20, thus facilitating the installation and use thereof.

What is claimed is:

1. A cylinder and dip tube device including
   a container, said container containing an elongated metallic cylindrical portion having an inner surface defining a volume the cross section of which is substantially uniform through the length of said cylindrical portion, a bottom metallic closure portion having a flat bottom and an inner surface, and a top metallic closure portion, said top closure portion having an inlet opening and an outlet opening, said cylindrical bottom and top portions being welded to a respectively associated end of said cylindrical portion in a sealing manner,
   a metallic dip tube depending from one end, within said cylindrical portion, from said top closure portion and having a connection to said inlet opening, the other end of said dip tube being disposed adjacent said inner surface of said bottom closure portion,
   a protective coating, the inner surfaces of said cylindrical portion and bottom closure portions and said dip tube being coated with said protective coating to provide a barrier to contamination of reactive material contained in said container by the metal of said cylindrical portion, said bottom closure portion, and said dip tube,
   inlet controllable valve means having inlet and outlet connecting means,
   outlet controllable valve means having inlet and outlet connecting means,
   a first pipe connection between said inlet opening of said top closure portion and said outlet connecting means of said inlet controllable valve means, said first pipe connection being sealed by welding, and
   a second pipe connection between said outlet opening of said top closure portion and said inlet connecting means of said outlet controllable valve means, said second pipe connection being sealed by welding.

2. A device as specified in claim 1 wherein the inner end of said dip tube has a slant cut providing a sharp edge, and wherein said inner surface of said bottom closure portion of said container includes a recess therein, the sharp edge of said dip tube being disposed in said recess.

3. A device as specified in claim 2 wherein said recess is rectangular and is centrally located on the inner surface of said bottom closure portion.

4. A device as specified in claim 1 wherein said top closure portion of said container further includes a fill opening for introducing reactive material into said container, and pipe plug means for closing said fill opening when said container has been loaded with said material, said plug being threaded to said top closure portion for sealing said fill opening.

5. A cylinder and dip tube device including a container, said container containing and elongated metallic cylindrical portion having and inner surface defining a volume the cross section of which is substantially uniform through the length of said cylindrical portion, a bottom metallic closure portion having a flat bottom and an inner surface, and a top metallic closure portion, said top closure portion having an inlet opening and an outlet opening, said cylindrical bottom and top portions being welded to a respectively associated end of said cylindrical portion in a sealing manner,
   a metallic dip tube depending from one end, within said cylindrical portion, from said top closure portion and having a connection to said inlet opening, the other end of said dip tube being disposed adjacent said inner surface of said bottom closure portion,
   a protective coating, the inner surfaces of said cylindrical and bottom closure portions and said dip tube being coated with said protective coating to provide a barrier to contamination of reactive material contained in said container by the metal of said cylindrical portion, said bottom closure portion, and said dip tube,
   inlet controllable valve means having inlet and outlet connecting means,
   outlet controllable valve means having inlet and outlet connecting means,
   a first pipe connection between said inlet opening of said top closure portion and said outlet connecting means of said inlet controllable valve means, said first pipe connection being sealed by welding, and
   a second pipe connection between said outlet opening of said top closure portion and said inlet connection means of said outlet controllable valve means, said second pipe connection being sealed by welding,
   wherein said inlet and said outlet controllable valve means each comprises a diaphragm valve including a welded diaphragm for sealing the connection in each of said valve means between the inlet and outlet connecting means thereof.

6. A cylinder and dip tube device including a container, said container containing an elongated metallic cylindrical portion having an inner surface defining a volume the cross section of which is substantially uniform through the length of said cylindrical portion, a bottom metallic closure portion having a flat bottom and an inner surface, and a top metallic closure portion, said top closure portion having an inlet opening and an outlet opening, said cylindrical bottom and top portions being welded to a respectively associated end of said cylindrical portion in a sealing manner, wherein said top closure portion of said container further includes a fill opening for introducing reactive material into said container and pipe plug means for closing said fill opening when said container has been loaded with said material, said plug being threaded to said top closure portion for sealing said fill opening, wherein said outlet opening of said top closure portion branches off said fill opening, a metallic dip tube depending from one end, within said cylindrical portion, from said top closure portion and having a connection to said inlet opening, the other end of said dip tube being disposed adjacent said inner surface of said bottom closure portion, a protective coating, the inner surfaces of said cylindrical and bottom closure portions and said dip tube being coated with said protective coating to provide a barrier to contamination of reactive material contained in said container by the metal of said cylindrical portion, said bottom closure portion, and said dip tube, inlet controllable valve means having inlet and outlet connecting means, outlet controllable valve means having inlet and outlet connecting means, a first pipe connection between said inlet opening of said top closure portion and said outlet connecting means of said inlet controllable valve means, said first pipe connection being sealed by welding, and a second pipe connection between said outlet opening of said top closure portion and said inlet connecting means of said outlet controllable valve means, said second pipe connection being sealed by welding.

7. A cylinder and dip tube device including a container, said container containing an elongated metallic cylindrical portion having an inner surface defining a volume the cross section of which is substantially uniform through the length of said cylindrical portion, a bottom metallic closure portion having a flat bottom and an inner surface, and a top metallic closure portion, said top closure portion having an inlet opening and an outlet opening, said cylindrical bottom and top portions being welded to a respectively associated end of said cylindrical portion in a sealing manner, wherein said top closure portion of said container includes a fill opening for introducing electronic grade organometallic liquid into said container, said outlet opening of said top closure portion branching off said fill opening, and further including socket head pipe plug means for closing said fill opening when said container has been loaded with said liquid, said plug being threaded to said top closure portion for sealing said fill opening, a metallic dip tube depending from one end, within said cylindrical portion, from said top closure portion and having a connection to said inlet opening, the other end of said dip tube being disposed adjacent said inner surface of said bottom closure portion, wherein the inner end of said dip tube has a slant cut providing a sharp edge, wherein the inner surface of said bottom closure portion of said container includes a centrally located rectangular recess, the sharp edge of said inner end of said dip tube being disposed in said recess, a protective coating, the inner surfaces of said cylindrical and bottom closure portions and said dip tube being coated with said protective coating to provide a barrier to contamination of reactive material contained in said container by the metal of said cylindrical portion, said bottom closure portion, and said dip tube, wherein said protective coating comprises a layer of polyvinylidine fluoride tetrafluoroethylene, inlet controllable valve means having inlet and outlet connecting means, outlet controllable valve means having inlet and outlet connecting means, wherein said inlet and outlet controllable valve means each comprises a diaphragm valve including a welded diaphragm for sealing the connection of each of said valve means between the inlet and outlet connecting means thereof, a first pipe connection between said inlet opening of said top closure portion and said outlet connecting means of said inlet controllable valve means, said first pipe connection being sealed by welding, and a second pipe connection between said outlet opening of said top closure portion and said inlet connecting means of said outlet controllable valve means, said second pipe connection being sealed by welding.

8. A device as specified in claim 7 further including first coupling means for connecting said inlet connecting means of said inlet controllable valve means to a source of gas inert to the organometallic liquid and second coupling means for connecting said outlet connecting means of said outlet controllable valve means to a deposition system.

9. A device as specified in claim 8 wherein the source of gas is a hydrogen source.

* * * * *